(12) United States Patent
Koike

(10) Patent No.: US 11,476,195 B2
(45) Date of Patent: Oct. 18, 2022

(54) WIRING STRUCTURE AND SEMICONDUCTOR DEVICE

(71) Applicant: Material Concept, Inc., Sendai (JP)

(72) Inventor: Junichi Koike, Miyagi (JP)

(73) Assignee: MATERIAL CONCEPT, INC., Sendai (JP)

(*) Notice: Subject to any disclaimer, the term of this patent is extended or adjusted under 35 U.S.C. 154(b) by 0 days.

(21) Appl. No.: 16/429,622

(22) Filed: Jun. 3, 2019

(65) Prior Publication Data

US 2019/0371733 A1 Dec. 5, 2019

(30) Foreign Application Priority Data

Jun. 4, 2018 (JP) .............................. JP2018-106833
Jan. 31, 2019 (JP) .............................. JP2019-016200

(51) Int. Cl.
*H01L 29/43* (2006.01)
*H01L 23/532* (2006.01)
*H01L 21/768* (2006.01)

(52) U.S. Cl.
CPC .. *H01L 23/53219* (2013.01); *H01L 21/76838* (2013.01); *H01L 23/5329* (2013.01); *H01L 23/53233* (2013.01)

(58) Field of Classification Search
CPC ......... H01L 23/53219; H01L 21/76838; H01L 23/5329; H01L 23/53233; H01L 23/53209; H01L 23/49811; H01L 23/49894; H01L 23/49866; H01L 21/4846; H01L 29/0673; H01L 29/7869; H01L 29/0665; H01L 21/02603; H01L 24/83; H01L 29/4908; H01L 21/02521; H01L 21/02532
See application file for complete search history.

(56) References Cited

U.S. PATENT DOCUMENTS

| 2009/0004490 A1* | 1/2009 | Gotou ..................... C22C 21/00 428/469 |
| 2012/0135158 A1* | 5/2012 | Freer ................. H01L 21/02603 427/532 |

(Continued)

OTHER PUBLICATIONS

A. E. Kaloyeros and E. Eisenbraun, "Ultrathin Diffusion Barriers/Liners for Gigascale Copper Metallization," Annual Review of Materials Science; 30, 363-385 (2000); pp. 363-385.

(Continued)

*Primary Examiner* — Samuel Park
(74) *Attorney, Agent, or Firm* — Cantor Colburn LLP

(57) ABSTRACT

To provide a wiring material which does not require a diffusion barrier layer and exhibits excellent conductivity and adhesion property between a conductor and an insulator and a semiconductor element using the same. The wiring structure of the present invention includes a conductor containing an intermetallic compound and an insulator layer. The intermetallic compound preferably contains two or more kinds of metal elements selected from the group consisting of Al, Fe, Co, Ni, and Zn. In addition, the intermetallic compound is preferably one or more kinds selected from an intermetallic compound containing Al and Co, an intermetallic compound containing Al and Fe, an intermetallic compound containing Al and Ni, an intermetallic compound containing Co and Fe, or an intermetallic compound containing Ni and Zn.

11 Claims, 8 Drawing Sheets

(56) References Cited

U.S. PATENT DOCUMENTS

| | | | |
|---|---|---|---|
| 2012/0218677 A1* | 8/2012 | Fujisawa | C22C 1/0433 |
| | | | 361/301.4 |
| 2014/0021466 A1* | 1/2014 | Yamazaki | H01L 29/7869 |
| | | | 257/43 |
| 2016/0248118 A1* | 8/2016 | Chan | H01M 10/058 |
| 2016/0379719 A1* | 12/2016 | Katoh | H01L 29/24 |
| | | | 365/96 |
| 2018/0078470 A1* | 3/2018 | Gershon | A61K 8/29 |

OTHER PUBLICATIONS

D. Gall, "Electron mean free path in elemental metals," Journal of Applied Physics 119, 085101 (2016); 5 pages.

Linghan Chen et al., "NiAl as a potential material for liner- and barrier-free interconnect in ultrasmall technology node," American Institute of Physics 113; 2018, 5 pages.

\* cited by examiner

WIRING STRUCTURE AND SEMICONDUCTOR DEVICE

CROSS REFERENCE TO RELATED APPLICATIONS

The present invention claims priority under 35 U.S.C. § 119 to Japanese Application No. 2018-106833 filed Jun. 4, 2018 and Japanese Application No. 2019-016200 filed Jan. 31, 2019, the entire content of which is incorporated herein by reference.

BACKGROUND OF THE INVENTION

Field of the Invention

The present invention relates to a wiring structure having a multilayer wiring structure for connecting a transistor and an external circuit to each other and a semiconductor device.

Related Art

Semiconductor devices have a multilayer wiring structure for connecting a transistor and an external circuit to each other. Among these, a multilayer wiring structure includes a conductor wiring composed of copper, an insulator, and a diffusion barrier layer disposed at the interface between these. The diffusion barrier layer is used to prevent copper from diffusing into the insulator and is usually a laminate of TiN or TaN and any of Ti, Ta, Ru, or Co (Non-patent Document 1).

Here, in the case of fabricating a multilayer wiring structure, first, an insulator film is formed, next, a groove is formed by etching the surface of the insulator film using a photolithography method, a diffusion barrier layer is formed inside the groove, and finally copper is embedded inside the groove to form a conductor wiring.

Meanwhile, in recent years, the miniaturization of components constituting semiconductor devices is performed in order to realize high performance of semiconductor devices. The multilayer wiring structure is also miniaturized, and the electrical resistance of the conductor wiring thus increases. The mean free path of free electrons of copper in a conductor wiring is about 40 nm, and thus the electrical resistivity rapidly increases when the multilayer wiring structure is miniaturized so that the line width or line height of the conductor wiring is 40 nm or less.

It has been proposed that a metal having the product of the mean free path and the bulk electrical resistivity being smaller than that of copper is selected and replaces copper in order to avoid that the excessive increase of the electrical resistivity of the conductor wiring having a line width of 40 nm or less. For example, Non-Patent Document 2 proposes Rh, Ir, Ni, Mo, Co, and Ru as such a metal. However, such a metal tends to aggregate on the surface of the insulator, and it is difficult to embed the metal in the groove for wiring formed in the insulator.

Another problem of current multilayer wiring structures is that the diffusion barrier layer occupies a part of the groove that is supposed to be occupied by the conductor wiring. For this reason, the effective resistivity of wiring is a higher value as compared to the case of not having a diffusion barrier layer. In order to avoid the excessive increase of electrical resistivity by the presence of the diffusion barrier layer, it is conceivable to use a conductor material which does not require a diffusion barrier layer, but such materials are not utilized at present.

As described above, there is a problem in the multilayer wiring structure of semiconductor devices that the electrical resistivity of copper wiring excessively increases as miniaturization is advanced. In addition, there is a problem that copper is likely to aggregate at the time of deposition and it is difficult to embed copper in a groove for wiring formed in an insulator. Furthermore, there is a problem that the effective electrical resistivity excessively increases as the diffusion barrier layer occupies a part of the wiring groove.

Non-Patent Document 1: A. E. Kaloyeros and E. Eisenbraun, Annual Review of Materials Science, 30, 363-385(2000).

Non-Patent Document 2: D. Gall, Journal of Applied Physics, 119,085201(2016).

SUMMARY OF THE INVENTION

The present invention has been made in view of the above circumstances, and an object thereof is to provide a wiring material which does not require a diffusion barrier layer and exhibits excellent conductivity and good adhesion property between a conductor and an insulator and a semiconductor element using the same.

The present inventors have found out that a wiring material which does not require a diffusion barrier layer and exhibits excellent conductivity and good adhesion property between a conductor and an insulator can be obtained by using an intermetallic compound as a conductor and have thus completed the present invention. Specifically, the present invention provides the following.

(1) A wiring structure including a conductor containing an intermetallic compound and an insulator layer.

(2) The wiring structure according to (1), in which the intermetallic compound contains two or more kinds of metal elements selected from the group consisting of Al, Fe, Co, Ni, and Zn.

(3) The wiring structure according to (1) or (2), in which the intermetallic compound is one or more kinds selected from an intermetallic compound containing Co and Al, an intermetallic compound containing Fe and Al, an intermetallic compound containing Ni and Al, an intermetallic compound containing Fe and Co, or an intermetallic compound containing Ni and Zn.

(4) The wiring structure according to (1), in which the insulator layer contains an inorganic oxide, the intermetallic compound contains a first metal element and a second metal element, an absolute value of standard free energy of formation of an oxide of the first metal element is smaller than an absolute value of standard free energy of formation of an oxide in the insulator layer, and an absolute value of standard free energy of formation of an oxide of the second metal element is larger than the absolute value of standard free energy of formation of an oxide in the insulator layer.

(5) The wiring structure according to (1) or (4), in which the intermetallic compound contains a first metal element and a second metal element, the first metal element is one or more kinds selected from the group consisting of Fe, Co, Ni, Cu, and Zn, and the second metal element is one or more kinds selected from the group consisting of Al and Sb.

(6) The wiring structure according to any one of (1), (4), or (5), in which a metal oxide layer formed by bonding at least of the second metal element with oxygen is interposed between the conductor and the insulator layer.

(7) The wiring structure according to any one of (1) and (4) to (6), in which the intermetallic compound is one or more kinds selected from the group consisting of an intermetallic compound containing Co and Al, an intermetallic compound containing Fe and Al, an intermetallic compound containing Ni and Al, an intermetallic compound containing Cu and Al, and an intermetallic compound containing Ni and Sb.

(8) The wiring structure according to any one of (1) to (7) for connecting a semiconductor element and an external circuit to each other in a semiconductor device.

(9) A semiconductor device including a semiconductor element and a wiring structure, in which the wiring structure includes a conductor containing an intermetallic compound and an insulator layer and connects the semiconductor element and an external circuit to each other.

(10) The semiconductor device according to (9), in which the insulator layer contains an inorganic oxide, the intermetallic compound contains a first metal element and a second metal element, an absolute value of standard free energy of formation of an oxide of the first metal element is smaller than an absolute value of standard free energy of formation of an oxide in the insulator layer, and an absolute value of standard free energy of formation of an oxide of the second metal element is larger than the absolute value of standard free energy of formation of an oxide in the insulator layer.

(11) The semiconductor device according to (9) or (10), in which the intermetallic compound contains a first metal element and a second metal element, the first metal element is one or more kinds selected from the group consisting of Fe, Co, Ni, Cu, and Zn, and the second metal element is one or more kinds selected from the group consisting of Al and Sb.

(12) The semiconductor device according to any one of (9) to (11), in which a metal oxide layer formed by bonding at least of the second metal element with oxygen is interposed between the conductor and the insulator layer.

(13) The semiconductor device according to any one of (9) to (12), in which the intermetallic compound is one or more kinds selected from the group consisting of an intermetallic compound containing Co and Al, an intermetallic compound containing Fe and Al, an intermetallic compound containing Ni and Al, an intermetallic compound containing Cu and Al, and an intermetallic compound containing Ni and Sb.

(14) A method of manufacturing the wiring structure according to any one of (1) to (8), including heating a substrate having an insulator layer containing an oxide to 100° C. or more and 500° C. or less and vapor-depositing two kinds of metal elements on the substrate to form a conductor containing an intermetallic compound.

According to the present invention, a wiring structure of a semiconductor element does not require a diffusion barrier layer and can avoid that the effective electrical resistivity becomes an excessively high value, for example, even when wiring having a fine conductor with a line width of 40 nm or less is formed, and thus it is possible to manufacture a high performance semiconductor device using this wiring structure.

DETAILED DESCRIPTION OF THE INVENTION

Figure 1:
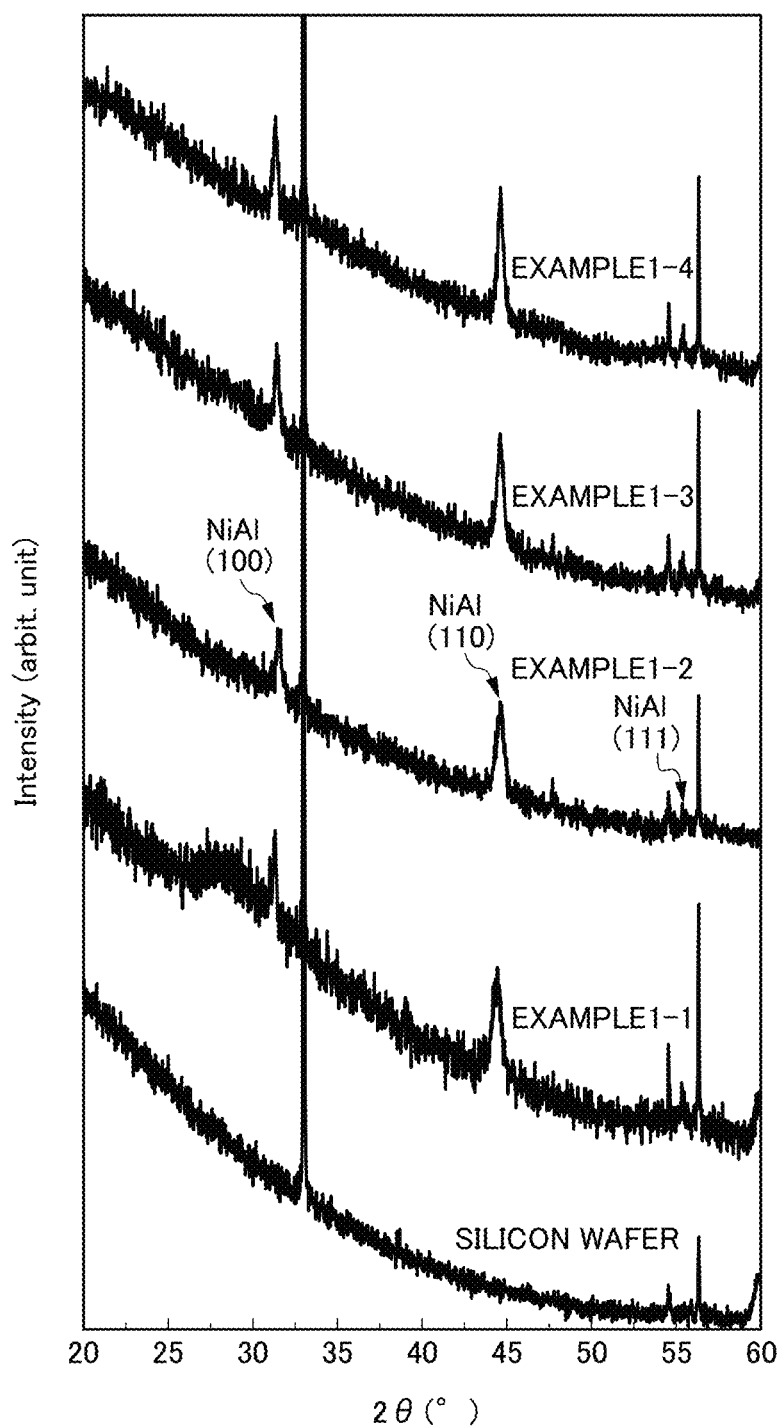
FIG. 1 illustrates X-ray diffraction patterns of samples of Examples 1-1 to 1-4 and a silicon wafer.

Hereinafter, specific embodiments of the present invention will be described in detail. Incidentally, the present invention is not limited to the following embodiments at all and can be implemented by appropriately adding changes thereto within the scope of the object of the present invention.

Incidentally, in the present specification, the notation "$M_1M_2$" ($M_1$ and $M_2$ represent metal elements different from each other) refers to an intermetallic compound containing $M_1$ and $M_2$ but does not indicate the stoichiometric relation between $M_1$ and $M_2$. In other words, the description of "$M_1M_2$" does not indicate only that $M_1:M_2$ is 1:1 as a molar ratio, and an error of about ±10 mol % from the theoretical integer ratio is allowed for each of the metal elements.

[Wiring Structure]

The wiring structure according to the present embodiment includes a conductor containing an intermetallic compound and an insulator layer. Such a wiring structure has a structure in which the outer circumference of the linear conductor is covered with the insulator layer.

The intermetallic compound as a conductor exhibits higher conductivity than copper when the diameter of the wiring is about 10 nm or less. As described above, in order to realize high performance of a semiconductor device to be required in recent years, the miniaturization of components constituting the semiconductor device has been advanced and such properties of the intermetallic compound satisfy the demand for high performance of a semiconductor device.

On the other hand, the intermetallic compound as a conductor has a regular crystal structure and the chemical bond thereof is an ionic bond, thus the bonding power is strong and is not easily dissociated and do not diffuse into the adjacent insulator. In addition, such an intermetallic compound has a high melting point and thus exhibits excellent resistance to electromigration failure even when the line width of the conductor is narrowed and the current density increases. Furthermore, these intermetallic compounds exhibit excellent oxidation resistance, and thus an increase in wiring resistance due to oxidation does not occur even in long-term use.

In other words, such an intermetallic compound exhibits excellent resistance to the insulation failure caused by the diffusion of the constituent metal elements into the adjacent insulator, and thus it is not always required to provide a wiring structure using this with a diffusion barrier layer. In other words, the conductor and the insulator layer may be in contact with each other. It is possible to effectively utilize the entire volume of the groove for wiring formed in the insulator as a diffusion barrier layer is not provided but the conductor and the insulator layer are in contact with each other in this manner. As a result, it is possible to maintain the effective resistivity at a lower value as compared to a case in which a diffusion barrier layer and Cu wiring are formed in the groove for wiring having the same width.

In such a wiring structure, it is preferable that the constituent elements of the intermetallic compound and oxygen in the insulator layer are bonded to each other at the interface between the conductor and the insulator layer. The range over which this bonding of the metal element with oxygen extends may be one atomic spacing or a metal oxide layer of several atomic layers. Specifically, the metal element to be bonded to oxygen may be either (second metal element) of the two kinds of metal elements in a case in which the intermetallic compound contains two kinds of metal elements of a first metal element and a second metal element.

In addition, in a case in which the intermetallic compound contains two kinds of metal elements of the first metal element and the second metal element and the insulator layer contains an inorganic oxide, it is preferable that the absolute value of standard free energy of formation of an oxide of the first metal element is smaller than the absolute value of standard free energy of formation of an oxide forming the insulator layer and the absolute value of standard free energy of formation of an oxide of the second metal element is larger than the absolute value of standard free energy of formation of an oxide forming the insulator layer in such a wiring structure. By selecting the first metal element and the second metal element in this manner, the second metal element is strongly bonded to oxygen in the insulator layer. The good adhesion property between the wiring and the insulator layer can be enhanced by this. Furthermore, the wettability between the wiring and the insulator layer can be enhanced, and the wiring can be easily embedded inside the wiring-shaped groove formed in the insulator layer. In addition, by using the first metal element and the second metal element in such combination, the bonding becomes an ionic bond and a wiring material having a firm bond can be obtained.

Incidentally, the standard free energy of formation of an oxide at 600 K is as follows.

TABLE 1

| Metal element | Standard free energy of formation of oxide (kJ/mol) |
| --- | --- |
| Al | −235 |
| Co | −90 |
| Fe | −65~−108 |
| Ni | −90 |
| Zn | −137 |
| Cu | −40~−59 |
| Si | −192 |
| Sb | −205 |

Specifically, the intermetallic compound is not particularly limited but is preferably one containing two or more kinds of metal elements selected from the group consisting of Al, Fe, Co, Ni, and Zn.

As such an intermetallic compound, for example, an intermetallic compound (CoAl) containing Co and Al, an intermetallic compound (FeAl) containing Fe and Al, an intermetallic compound (NiAl) containing Ni and Al, an intermetallic compound (FeCo) containing Fe and Co, or an intermetallic compound (NiZn) containing Ni and Zn is preferable. These intermetallic compounds have an advantage that the electrical resistivity of a bulk body thereof at room temperature is lower than that of other intermetallic compounds. Furthermore, these intermetallic compounds have a composition width so as to stably exist as an intermetallic compound and are thus easily fabricated.

In addition, in another aspect, as the intermetallic compound, for example, it is preferable to use an intermetallic compound containing at least two or more kinds of metal elements selected from the group consisting of Fe, Co, Ni, Cu, Zn, Al, and Sb and it is more preferable to use an intermetallic compound containing one or more kinds selected from the group consisting of Fe, Co, Ni, Cu, and Zn as the first element and one or more kinds selected from the group consisting of Al and Sb as the second element.

As such an intermetallic compound, for example, it is preferable to use an intermetallic compound (CoAl) containing Co and Al, an intermetallic compound (FeAl) containing Fe and Al, an intermetallic compound (NiAl) containing Ni and Al, an intermetallic compound ($CuAl_2$) containing Cu and Al, or an intermetallic compound (NiSb) containing Ni and Sb.

The intermetallic compound is not particularly limited, but it is more preferable to use one having an ordered body-centered cubic crystal structure. As the intermetallic compound has an ordered body-centered cubic crystal structure, a conductor which does not depend on the crystal orientation and does not have a variation in properties regardless of the crystal orientation is obtained.

In addition, in another aspect, the intermetallic compound is not particularly limited, but it is more preferable to use one having a tetragonal crystal ordered structure. As the intermetallic compound has an ordered tetragonal crystal structure, a conductor which does not strongly depend on the crystal orientation and does not have a strong variation in properties regardless of the crystal orientation is obtained in the same manner as in the case of having an ordered body-centered cubic crystal structure. Incidentally, examples of the intermetallic compound having an ordered tetragonal crystal structure may include $CuAl_2$.

The intermetallic compound is not particularly limited, but it is preferable to use one containing two kinds of metal elements. In such a case, as the ratio of two kinds of metal elements (first metal element:second metal element), it is preferable to use one having an atomic ratio of from 48.5:51.5 to 51.5:48.5 and it is more preferable to use one having an atomic ratio of from 49.0:51.0 to 51.0:49.0 in a case in which the intermetallic compound is one having a ratio of about 1:1 (for example, AlCo, AlFe, AlNi, or NiSb). In a case in which the ratio of two kinds of metal elements is 50:50, an ordered structure without atomic defects is obtained and thus the electrical resistance value is the smallest value. However, the ordered structure of the intermetallic compound can be maintained and an increase in the resistance of the conductor can be suppressed in an allowable range when the ratio of two kinds of metal elements is in the range of required amount.

The intermetallic compound is not particularly limited, but it is preferable to use one containing two kinds of metal elements. In such a case, as the ratio of two kinds of metal elements (first metal element:second metal element), it is preferable to use one having an atomic ratio of from 30:70 to 37:63 and it is more preferable to use one having an atomic ratio of from 32:68 to 35:65 in a case in which the intermetallic compound is one having a ratio of about 1:2 (for example, $CuAl_2$). In a case in which the ratio of two kinds of metal elements is 33:67, an ordered structure without atomic defects is obtained and thus the electrical resistance value is the smallest value. However, the ordered structure of the intermetallic compound can be maintained and an increase in the resistance of the conductor can be suppressed in an allowable range when the ratio of two kinds of metal elements is in the range of required amount.

The line width (diameter) of the conductor is not particularly limited but is, for example, preferably 500 nm or less and more preferably 200 nm or less, still more preferably 100 nm or less, and particularly preferably 40 nm or less. As the line width of the conductor is equal to or less than the required amount, the components constituting a semiconductor device can be further miniaturized.

(Insulator Layer)

The insulator layer is not particularly limited as long as it exhibits insulating property, and inorganic oxides, inorganic nitrides, inorganic oxynitrides, and the like can be widely used. For example, $SiO_2$, SiOCH, $SiN_x$, SiON, and resins containing silicon and the like can be used. Among these, it is preferable to use an insulator having a Si—O bond such as $SiO_2$ or SiOCH. In the case of using $SiO_2$ and SiOCH, the insulator layer is excellent in all of the insulating property, mechanical strength, elastic modulus, and heat resistance.

The shape of the insulator layer is not particularly limited as long as it surrounds the periphery of the conductor, and the insulator layer can be appropriately designed depending on the use. For example, the insulator layer may have a tubular shape so as to surround the periphery of the conductor, or a bulk-shaped or film-shaped insulator layer may be provided with a cavity so as to surround the periphery of the conductor. Specific examples of such a cavity may include a via hole and a wiring groove. In addition, the insulator layer may have an air gap structure.

The wiring structure formed in this manner can be used, for example, to connect a semiconductor element and an external circuit to each other as described later.

[Semiconductor Device]

The semiconductor device according to the present embodiment is a semiconductor device including a semiconductor element and a wiring structure, in which the wiring structure includes a conductor containing an intermetallic compound containing two or more kinds of metal elements selected from the group consisting of Al, Fe, Co, Ni, and Zn and an insulator layer and connects the semiconductor element and an external circuit to each other. Incidentally, the features of the wiring structure are as described above and thus the description thereon here is omitted.

The semiconductor element is not particularly limited, and examples thereof may include field effect transistors such as MOSFET, FinFET, and GAAFET and memories such as V-NAND, DRAM, RRAM (registered trademark), PRAM, and MRAM. Among these, it is preferable to use a transistor which is required to be operated at a high speed.

The external circuit is not particularly limited, and examples thereof may include a power supply circuit and a control circuit.

[Method of Manufacturing Wiring Structure/Semiconductor Device]

An example of a method of manufacturing a semiconductor device as described above will be described more specifically. First, phosphorus (P) or boron (B) is added to a part of the silicon substrate to adjust the carrier concentration, and a channel region is formed. Next, a gate electrode, a source electrode, and a drain electrode are formed in the vicinity of the channel region, and a transistor structure is formed.

A wiring structure is present on the upper part of such a transistor, and contacts, conductor wirings such as M0, M1, and M2 are sequentially formed. In order to form this wiring structure, first, an insulator layer having Si—O as a basic structural skeleton such as $SiO_2$ or SiOCH is formed on the upper part of the transistor by a plasma-enhanced chemical vapor deposition (PE-CVD) method or a spin coating method. In the insulator layer thus obtained, grooves having a wiring shape and holes having a via shape are formed by a lithography method. Thereafter, an intermetallic compound is formed in the via hole and the wiring groove by a sputtering method, a chemical vapor deposition (CVD) method, a PE-CVD method, an atomic layer deposition (ALD) method, a plasma-enhanced atomic layer deposition (PE-ALD) method, and the like. In a case in which the intermetallic compound is generated in an excessive amount, the intermetallic compound is removed by a chemical mechanical polishing (CMP) method and flattening is performed. These steps are repeated to form a multilayer wiring structure.

More specifically, the wiring structure as described above can be manufactured by heating the substrate having an insulator layer containing an oxide to 100° C. or more and 500° C. or less and vapor-depositing two kinds of metal elements on the substrate to form a conductor containing an intermetallic compound.

Incidentally, in the semiconductor device, one device is provided with a plurality of wiring structures in some cases. In such a semiconductor device, particularly, the wiring (for example, wiring having a line width of 50 nm or more) having a thick line width of the multilayer wiring structure or the via can also be formed of a diffusion barrier layer and Cu as in the conventional method. In this case, a two-layer structure of Co/TaN or Ta/TaN which is a diffusion barrier layer of Cu wiring can be provided between the intermetallic compound wiring and Cu. By having such a structure, it is possible to prevent an increase in the wiring resistance due to mutual diffusion of the intermetallic compound wiring and Cu or to prevent the formation of high-resistance interface layer by mutual reaction thereof.

EXAMPLES

The present invention will be described in more detail with reference to the following Examples. The present invention is not limited to these Examples at all.

Evaluation on Structure of AlNi Thin Film Sample (Example 1-1) AlNi Thin Film Sample not Subjected to Heat Treatment A $SiO_2$ film having a thickness of 100 nm as an insulator was formed on a silicon wafer substrate by plasma-enhanced chemical vapor deposition (PE-CVD).

Next, pure metals of Al and Ni as raw materials (sputtering targets) were simultaneously deposited on the $SiO_2$ film by a direct current sputtering method, thereby obtaining an Al—Ni alloy. The atomic ratio of Al to Ni was set to 50:50. An AlNi thin film sample was fabricated by adjusting the deposition conditions so that Al and Ni had an equal concentration.

(Example 1-2) AlNi Thin Film Sample Subjected to Heat Treatment at 250° C.

An AlNi thin film sample was fabricated by further heating an AlNi thin film obtained in the same manner as in Example 1-1 at 250° C. for 30 minutes.

(Example 1-3) AlNi Thin Film Sample Subjected to Heat Treatment at 400° C.

An AlNi thin film sample was fabricated by further heating an AlNi thin film obtained in the same manner as in Example 1-1 at 400° C. for 30 minutes.

(Example 1-4) AlNi Thin Film Sample Subjected to Heat Treatment at 500° C.

An AlNi thin film sample was fabricated by further heating an AlNi thin film obtained in the same manner as in Example 1-1 at 500° C. for 30 minutes.

The structures of the samples of Examples 1-1 to 1-4 and the silicon wafer were analyzed by an X-ray diffraction method. FIG. 1 illustrates the X-ray diffraction patterns of the samples of Examples 1-1 to 1-4 and the silicon wafer.

As can be seen from FIG. 1, the angles at which diffraction peaks were observed were 31.0°, 44.4°, and 55.1° in all of the samples. These diffraction peaks correspond to the 100, 110, and 111 reflections of a body-centered cubic crystal ordered structure, respectively. From this result, it has been found that the crystal structure of the AlNi thin film is an ordered body-centered cubic crystal structure.

Figure 2A:
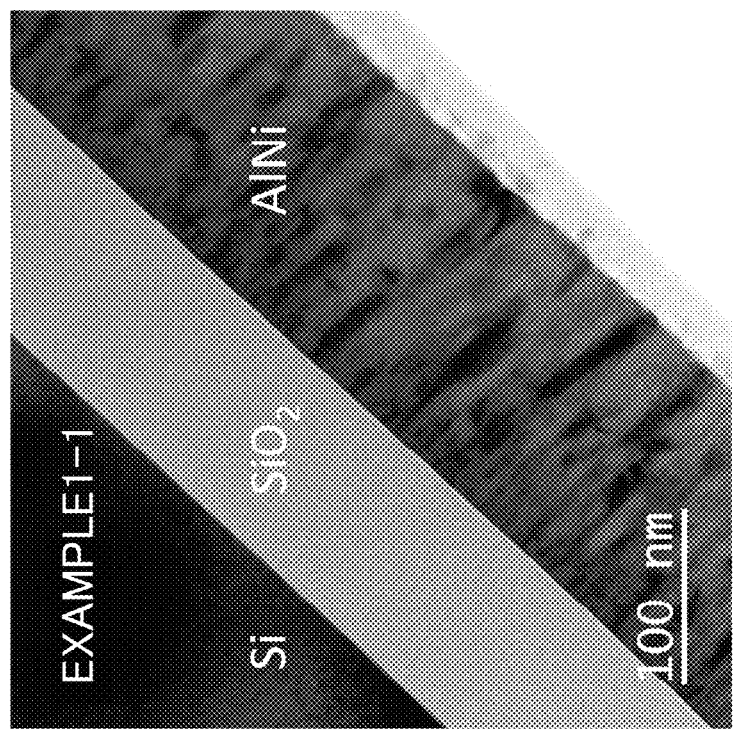
FIG. 2A illustrates a transmission electron micrograph of a cross section of a sample of Example 1-1.
Figure 2B:
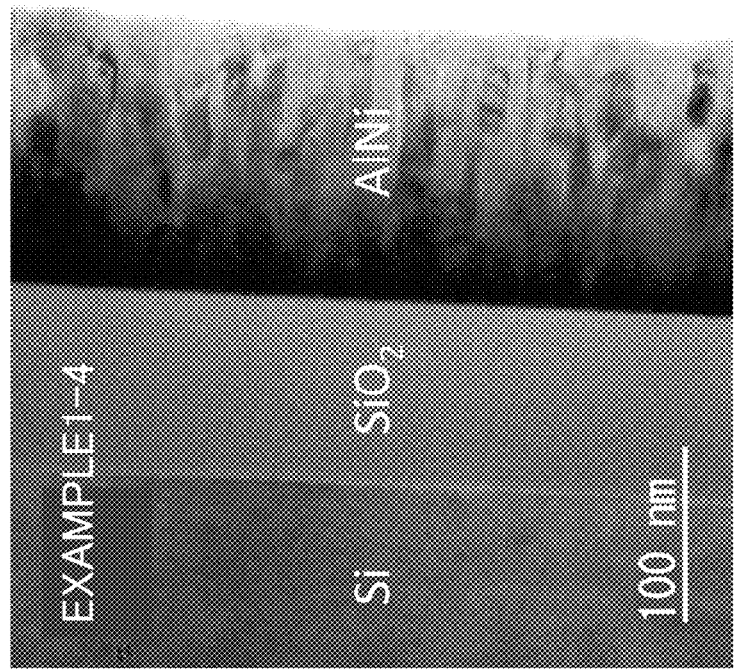
FIG. 2B illustrates a transmission electron micrograph of a cross section of a sample of Example 1-4.

The cross sections of the samples of Example 1-1 and Example 1-4 were observed with a transmission electron microscope. FIG. 2A illustrates a transmission electron micrograph of the cross section of the sample of Example 1-1, and FIG. 2B illustrates a transmission electron micrograph of the cross section of the sample of Example 1-4. In both of the samples, columnar crystals in which crystal grains were extended in the film thickness direction were formed. The average length of the columnar crystals in the film thickness direction was about 80 nm in Example 1-1 (not subjected to heat treatment) and 150 nm in Example 1-4 (subjected to heat treatment at 500° C.). The average length of the columnar crystals in the in-plane direction was about 9 nm in Example 1-1 (not subjected to heat treatment) and about 16 nm in Example 1-4 (subjected to heat treatment at 500° C.).

Figure 3A:
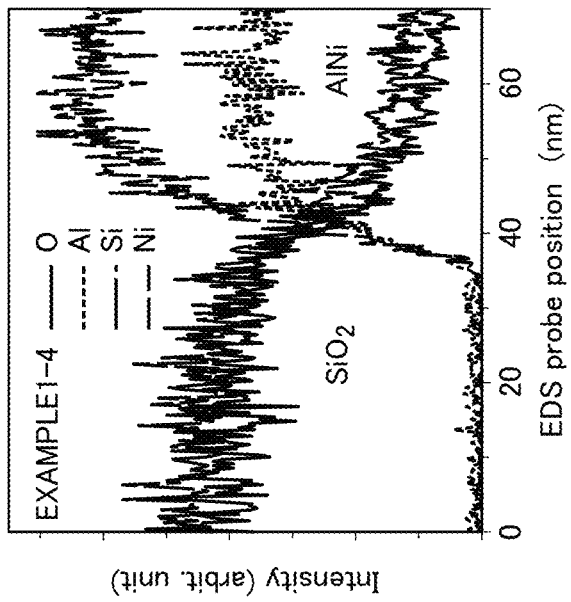
FIG. 3A illustrates an EDX analysis result obtained by scanning an electron beam in a region including a $SiO_2$ film and an AlNi thin film in a sample of Example 1-1.
Figure 3B:
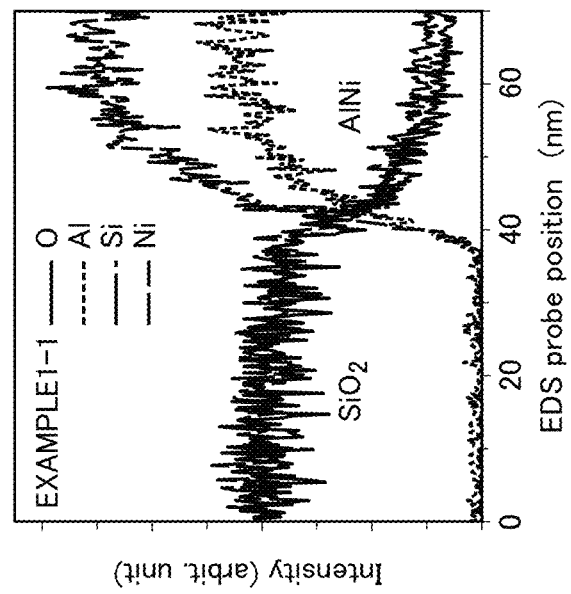
FIG. 3B illustrates an EDX analysis result obtained by scanning an electron beam in a region including a $SiO_2$ film and an AlNi thin film in a sample of Example 1-4.

The elemental compositions in the cross sections of the samples of Examples 1-1 and 1-4 were analyzed using an EDX (X-ray energy dispersive spectroscopy) apparatus attached to a transmission electron microscope. FIG. 3A illustrates the EDX analysis result obtained by scanning an electron beam in a region including the $SiO_2$ film and AlNi thin film in the sample of Example 1-1, and FIG. 3B illustrates the EDX analysis result obtained by scanning an electron beam in a region including the $SiO_2$ film and AlNi thin film in the sample of Example 1-4. In these FIGS. 3A and 3B, the vertical axis represents the characteristic X-ray intensity of the constituent elements. In both of the samples, neither Al nor Ni was detected in the $SiO_2$ film. In addition, in both of the samples, O and Si were detected in the AlNi film. In the sample of Example 1-1 (not subjected to heat treatment) as well, O and Si are detected in the AlNi film and the relative intensities thereof do not change even after the heat treatment. Hence, O and Si in the AlNi film are due to the re-deposition on the surface of the cross-sectional sample from the $SiO_2$ layer and the Si wafer substrate at the time of fabrication of the cross-sectional sample. In addition, elements other than the constituent elements of both films were not detected at the interface between the AlNi film and the $SiO_2$ film. From these results, it can be said that the $SiO_2$ film and the AlNi film do not form another layer at the interface but are in direct contact with each other and mutual diffusion thereof is not caused even by a heat treatment at 500° C. for 30 minutes in both of the samples of Example 1-1 and Example 1-4.

[Evaluation on Electrical Characteristics of AlNi Thin Film Sample]

In order to reveal that the AlNi thin film does not require a diffusion barrier layer with respect to the $SiO_2$ film, a sample for C-V (capacitance-voltage) measurement having a MOS structure was fabricated and a change in flat band voltage after the sample was maintained at a high temperature and in a high electric field was measured. The sample for measurement was fabricated according to the following procedure.

(Example 2-1) AlNi Thin Film Sample not Subjected to Heat Treatment

As the Si substrate, a p-type silicon wafer was used, and a $SiO_2$ film was formed on the surface on one side thereof. Al was vapor-deposited on the back surface on which the $SiO_2$ film was not formed of the wafer, and a heat treatment was performed at 250° C. for 10 minutes, thereby forming an ohmic electrode. Thereafter, a photoresist film was formed on a $SiO_2$ film having a thickness of 20 nm, and an electrode pattern of the AlNi film was formed by a lift-off method. The size of the AlNi electrode sample was set to a square with a side of 200 μm.

(Example 2-2) AlNi Thin Film Sample Subjected to Heat Treatment at 300° C.

An AlNi thin film sample was fabricated by further heating an AlNi thin film obtained in the same manner as in Example 2-1 at 300° C. for 30 minutes.

(Examples 2-3 to 2-5) AlNi Thin Film Samples for BTS Test

The AlNi electrode samples (MOS samples) obtained in the same manner as in Example 2-1 were subjected to a BTS (bias temperature stress) test. Specifically, a voltage of 6 V (electric field intensity of 3 MV/cm) was applied between the front and back electrodes, and this state was maintained at 250° C. for 10 minutes (Example 2-3), 30 minutes (Example 2-4), and 60 minutes (Example 2-5).

Figure 4:
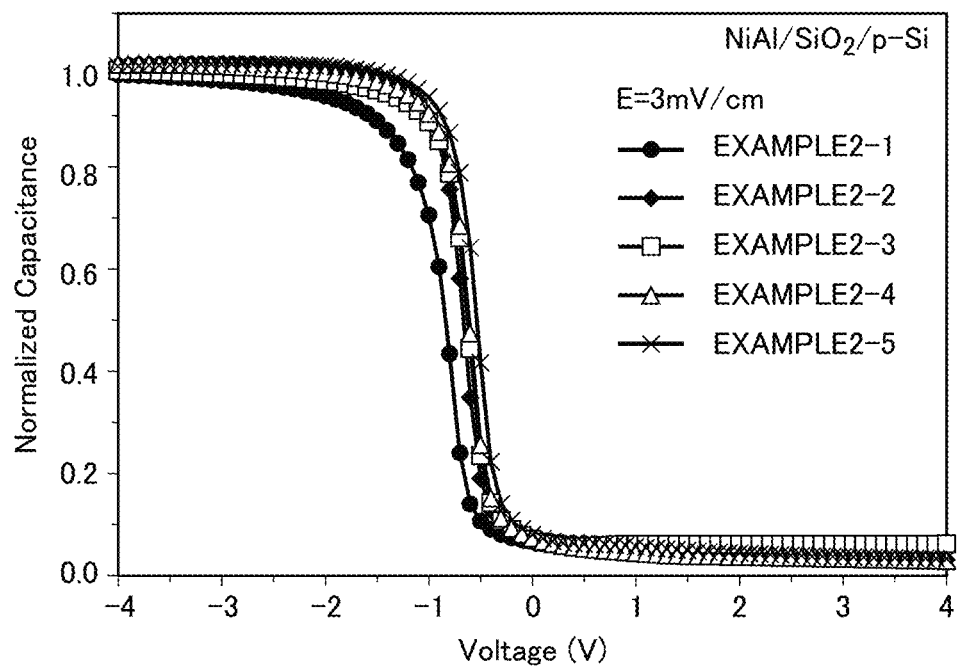
FIG. 4 illustrates C-V curves of samples of Examples 2-1 to 2-5.

The samples of Examples 2-1 to 2-5 were subjected to the C-V measurement. FIG. 4 illustrates the C-V curves of the samples of Examples 2-1 to 2-5. Specifically, this FIG. 4 illustrates a change in the capacitance when the voltage is swept. The C-V curve shifts in the negative voltage direction in a case in which the constituent elements of AlNi diffuse into $SiO_2$. In other words, the flat band potential shifts to the negative. However, as is illustrated in FIG. 4, the shift of the flat band in the negative direction has not been observed and it can be said that the diffusion of Al or Ni into $SiO_2$ has not occurred. It has been found that the AlNi thin film does not require a diffusion barrier layer unlike the conventional Cu thin film in this manner. As a reason for this, it is considered that it is difficult for Al and Ni to be dissociated from each other as independent atoms and to diffuse into $SiO_2$ since Al and Ni maintain a firm atomic bonding state similar to an ionic bond.

Influence of Ni:Al Ratio in AlNi Thin Film Sample on Electrical Resistivity (Example 3-1) AlNi Thin Film Sample not Subjected to Heat Treatment An AlNi thin film sample was fabricated in the same manner as in Example 1-1 except that the atomic ratio of Ni with respect to the total amount of Ni atoms and Al atoms, namely, the Ni concentration was controlled to be from 48.5 at % to 53.0 at % by changing the sputtering voltage when sputtering the respective metals. Incidentally, the thickness of the AlNi thin film was 260 nm.

(Example 3-2) AlNi Thin Film Sample Subjected to Heat Treatment at 250° C.

An AlNi thin film sample was fabricated in the same manner as in Example 1-2 except that the Ni concentration was controlled to be from 48.5 at % to 53.0 at % by changing the sputtering voltage when sputtering the respective metals. Incidentally, the thickness of the AlNi thin film was 260 nm.

(Example 3-3) AlNi Thin Film Sample Subjected to Heat Treatment at 400° C.

An AlNi thin film sample was fabricated in the same manner as in Example 1-3 except that the Ni concentration was controlled to be from 48.5 at % to 53.0 at % by changing the sputtering voltage when sputtering the respective metals. Incidentally, the thickness of the AlNi thin film was 260 nm.

(Example 3-4) AlNi Thin Film Sample Subjected to Heat Treatment at 500° C.

An AlNi thin film sample was fabricated in the same manner as in Example 1-4 except that the Ni concentration was controlled to be from 48.5 at % to 53.0 at % by changing the sputtering voltage when sputtering the respective metals. Incidentally, the thickness of the AlNi thin film was 260 nm.

Figure 5:
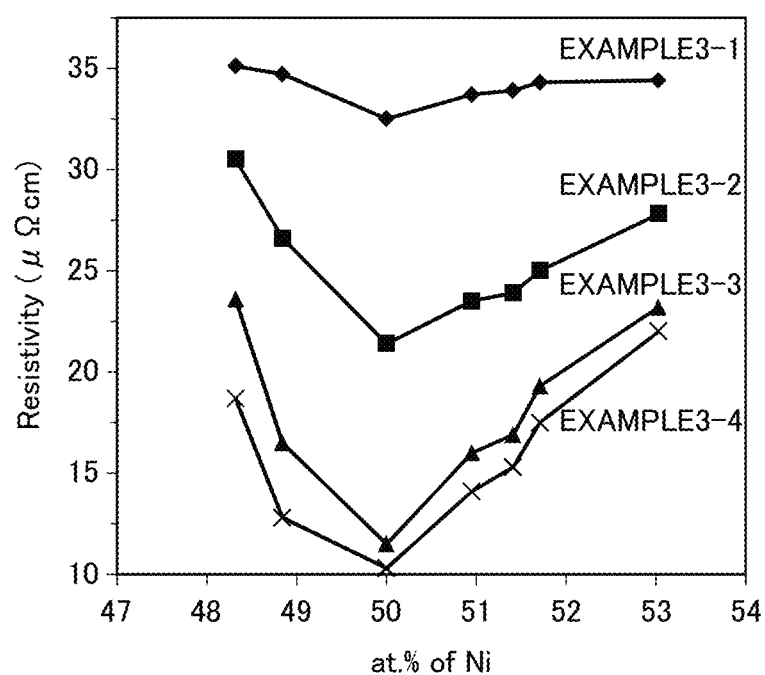
FIG. 5 illustrates Ni concentrations plotted with respect to electrical resistivities of samples of Examples 3-1 to 3-4.

The electrical resistivities of the samples of Examples 3-1 to 3-4 were measured. FIG. 5 illustrates the Ni concentrations plotted with respect to the electrical resistivities of the samples of Examples 3-1 to 3-4. As can be seen from FIG. 5, the electrical resistivity was the lowest at a Ni concentration of 50 at % and the electrical resistivity decreased along with an increase in the temperature for heat treatment in the samples of Examples 3-1 to 3-4.

Influence of Film Thickness of AlNi Thin Film Sample on Electrical Resistivity (Example 4-1) AlNi Thin Film Sample not Subjected to Heat Treatment An AlNi thin film sample was fabricated in the same manner as in Example 1-1 except that the thickness of the thin film was controlled by changing the time when sputtering the respective metals. Incidentally, the Ni concentration was set to 50 at %.

(Example 4-2) AlNi Thin Film Sample Subjected to Heat Treatment at 250° C.

An AlNi thin film sample was fabricated in the same manner as in Example 1-2 except that the thickness of the thin film was controlled by changing the time when sputtering the respective metals. Incidentally, the Ni concentration was set to 50 at %.

(Example 4-3) AlNi Thin Film Sample Subjected to Heat Treatment at 400° C.

An AlNi thin film sample was fabricated in the same manner as in Example 1-3 except that the thickness of the thin film was controlled by changing the time when sputtering the respective metals. Incidentally, the Ni concentration was set to 50 at %.

(Example 4-4) AlNi Thin Film Sample Subjected to Heat Treatment at 500° C.

An AlNi thin film sample was fabricated in the same manner as in Example 1-4 except that the thickness of the thin film was controlled by changing the time when sputtering the respective metals. Incidentally, the Ni concentration was set to 50 at %.

Figure 6:
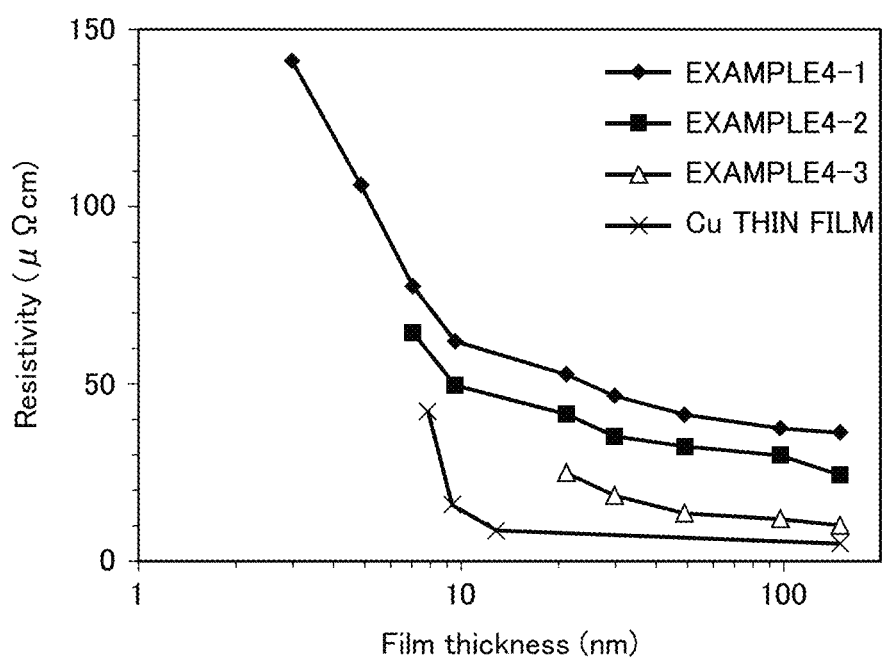
FIG. 6 illustrates film thicknesses plotted with respect to electrical resistivities of samples of Examples 4-1, 4-2, and 4-4.

The electrical resistivities of the samples of Examples 4-1, 4-2, and 4-4 were measured. FIG. 6 illustrates the film thicknesses plotted with respect to the electrical resistivities of the samples of Examples 4-1, 4-2, and 4-4. Incidentally, in this FIG. 6, the result for Cu thin film (not subjected to heat treatment) is also illustrated for comparison. The electrical resistivity of the Cu thin film rapidly increases when the film thickness is 8 nm or less and exceeds the electrical resistivity of the AlNi thin film. The rapid increase in resistivity of the Cu thin film is because the wettability of Cu with respect to $SiO_2$ is poor, thus Cu tends to aggregate in the state of not being subjected to a heat treatment, and the continuity of the thin film is inhibited in addition to the scattering of free electrons. From these results, it has been found that an AlNi thin film is more advantageous than a Cu thin film in a continuous film having a thickness of 8 nm or less from the viewpoint of electrical resistance.

In a case in which the metal wiring is formed inside a groove formed in an insulator, whether or not a diffusion barrier layer is required greatly affects the effective electrical resistivity of the wiring. In the case of conventional Cu wiring, a high-resistance diffusion barrier layer is formed on both side walls and bottom inside a wiring groove. The thickness thereof is about 5 nm, and the portion occupied by Cu in the wiring width (w) is w-10 nm. On the other hand, in the case of AlNi wiring, a diffusion barrier layer is not required and there is the advantage that AlNi can occupy the entire wiring width.

[Evaluation on Adhesion Strength of AlNi Thin Film Sample]

The adhesion strength between the AlNi thin film and the $SiO_2$ film was evaluated. Specifically, a tape test was performed according to ASTM D3359-79 using samples respectively having a film thickness of 150 nm and 100 nm among the samples of Examples 4-1 to 4-4. In addition, a sample in which a Cu thin film was formed on $SiO_2$ by 150 nm was also subjected to the same test for comparison. As a result, all of the samples of Examples 4-1 to 4-4 did not peel off at all by the tape test, but all of the Cu thin films peeled off. The samples of Examples 4-1 to 4-4 were subjected to the examination on the bonding state of Al in the vicinity of the interface by X-ray photoelectron spectroscopy, and as a result, it is considered that Al is in an oxidized state and Al exhibiting a strong tendency to form an oxide is bonded to oxygen of $SiO_2$ to maintain firm adhesion property in all of the samples.

Analysis of Structure

Example 5

An insulator layer containing $SiO_2$ was formed on a silicon substrate by plasma-enhanced chemical vapor deposition using tetraethyl orthosilicate (TEOS) as a raw material. A groove having a wiring shape was formed in the $SiO_2$ film by a photolithography method. Thereafter, the substrate was heated in a temperature range of from 100° C. to 500° C. Here, an example heated at 250° C. is described. Cu and Al were selected as a metal forming the wiring. Here, the standard free energy of formation of Cu oxide ($\Delta G^0$) is −40 to −59 kJ/mol, and the absolute value thereof is smaller than that of the standard free energy of formation of Si oxide ($\Delta G^0 = -192$ kJ/mol). On the other hand, the standard free energy of formation of Al oxide is −235 kJ/mol, and the absolute value thereof is larger than that of the standard free energy of formation of Si oxide. Pure metal targets of Cu and Al were vapor-deposited on the substrate in a state of being heated by a direct current sputtering method. At this time, the sputtering power was adjusted so that the composition ratio was Cu:Al=1:2.

Figure 7A:
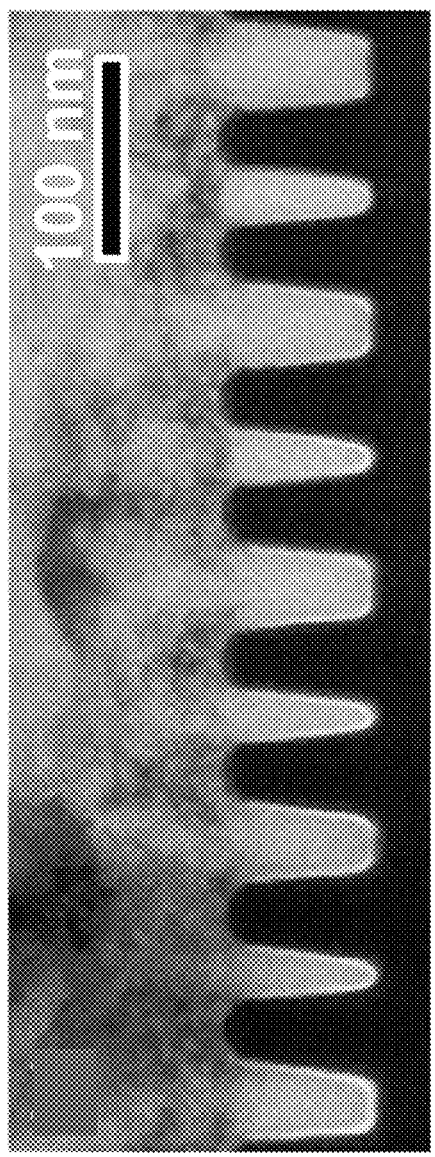
FIG. 7A illustrates a scanning transmission electron microscope (STEM) photograph of a cross section of a sample obtained in Example 5.
Figure 7B:
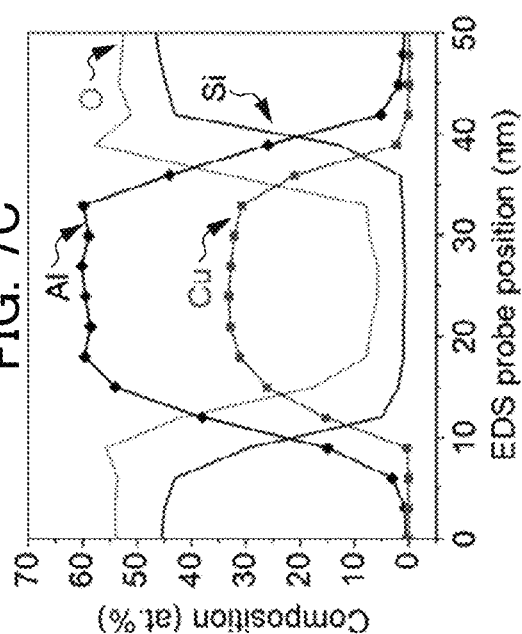
FIGS. 7B and 7C illustrate EDX analysis results of a sample obtained in Example 5.
Figure 7C:
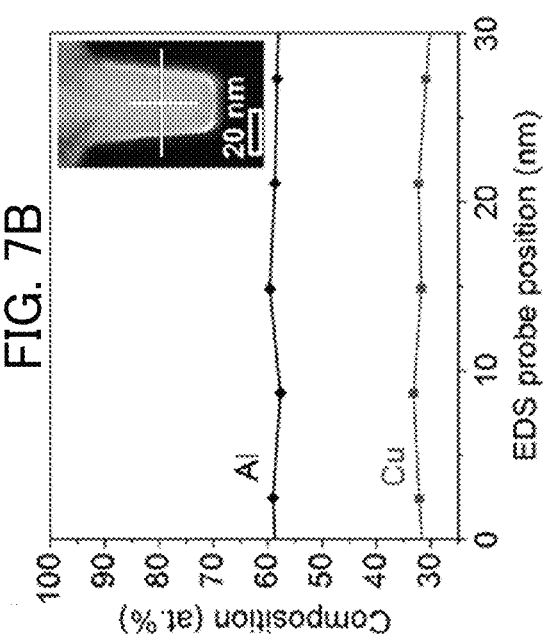

FIG. 7A illustrates a STEM photograph of the cross section of the sample obtained in Example 5. FIGS. 7B and 7C illustrate the EDX analysis results of the sample obtained in Example 5. More specifically, FIGS. 7B and 7C are the EDX analysis results obtained by scanning an electron beam in the vertical direction (on the vertical line) and the horizontal direction (on the horizontal line) in the illustration of FIG. 7B, respectively.

From FIG. 7A, a dense filling material was observed inside the groove formed in the $SiO_2$ insulator layer.

From FIG. 7B in which EDX analysis has been performed in the vertical direction in the illustration of FIG. 7B, it can be seen that the composition ratio of Cu to Al is about 1:2 at all of the points and a $CuAl_2$ intermetallic compound is formed in this direction.

On the other hand, according to FIG. 7C in which EDX analysis has been performed in the horizontal direction of FIG. 7C, it can be seen that the concentrations of Al and O are high in the vicinity of the interface between the wiring and the insulator layer and a layer having an Al—O bond is formed. This indicates that $SiO_2$ has been partially reduced by Al to form $AlO_x$ since the standard free energy of formation of Al oxide is larger than the standard free energy of formation of Si oxide. The wettability of the wiring with respect to the insulator layer is improved as Al preferentially covers the surface of the insulator layer at the time of sputtered deposition as well as the intermetallic compound and the insulator layer are in favorable adhesion with each other by this reaction, and as a result, this contributes to the dense embedding of the intermetallic compound in the wiring groove.

(Wiring Width Dependency of Wiring Resistance)

Wiring grooves having various widths were formed in the $SiO_2$ insulator layer by a photolithography method. The height and width of the wiring groove were set to be equal to each other. NiAl, $CuAl_2$, and NiSb intermetallic compounds were formed so as to be embedded inside the wiring groove by a sputtering method. The substrate was heated to 350° C., 250° C., and 300° C. when depositing the respective intermetallic compounds by sputtering. Thereafter, the intermetallic compound excessively formed on the upper surface of the insulator layer was polished and removed by a CMP method. The wiring grooves having a serpentine shape were formed at equal intervals. The electrical resistivity of the wiring in the wiring structure sample obtained was measured by a direct current four probe method. In addition, a sample (denoted as "Cu" in FIG. 7) in which pure Cu was embedded in the wiring groove was fabricated as a comparative sample. Furthermore, a sample (denoted as "Cu w L/B" in FIG. 7) in which a film having a two-layer structure of Ta/TaN was formed in a thickness of 2 nm and then pure Cu was embedded was also fabricated.

Figure 8:
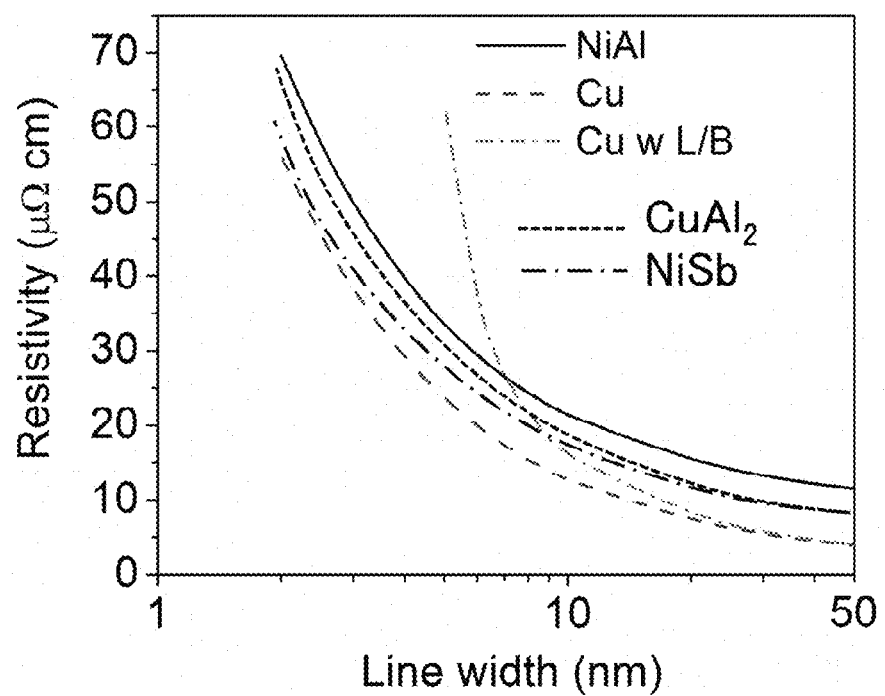
FIG. 8 illustrates a diagram showing the relation between a line width of a wiring electrode and an electrical resistivity in wiring structures in which NiAl, $CuAl_2$, NiSb, and copper are used as the wiring electrode.

FIG. 8 illustrates a diagram showing the relation between the line width of the wiring electrode and the electrical resistivity in the wiring structures in which NiAl, $CuAl_2$, NiSb, and copper are used as the wiring electrode. In FIG. 8, the horizontal axis represents the line width (nm) of the wiring electrode and the vertical axis represents the electrical resistivity ($\mu\Omega$ cm). As can be seen from FIG. 8, the wirings containing NiAl, $CuAl_2$, and NiSb intermetallic compounds do not have a lower resistance than the sample (Cu) in which pure Cu is embedded but have a lower resistance value than the Cu wiring having a film having a two-layer structure of Ta/TaN in a line width range of from 7 to 9 nm or less.

[Evaluation of AlFe, AlCo, CoFe, $CuAl_2$, NiZn, and NiSb Thin Films]

A p-type silicon wafer was used as a substrate, and a $SiO_2$ film was formed on the surface on one side thereof. Thin films of AlFe, AlCo, CoFe, $CuAl_2$, NiZn, and NiSb composed of two kinds of elements at an equal molar ratio (first element:second element) or 1:2 molar ratio were fabricated on the $SiO_2$ film by a sputtering method. Among these thin films, those not subjected to a heat treatment, those subjected to a heat treatment at 250° C. for 30 minutes, those subjected to a heat treatment at 400° C. for 30 minutes, and those subjected to a heat treatment at 500° C. for 30 minutes were respectively used as samples and subjected to the same analysis and evaluation as for the AlNi thin film samples.

From the measurement results of the EDX for cross section observation and the C-V curve of MOS sample, it has been confirmed that the constituent elements do not diffuse into the $SiO_2$ film even when all of the samples do not have a diffusion barrier layer. In addition, the electrical resistivity of each thin film was a lower value than that of the Cu thin film when the film thickness was 8 nm or less. In the tape test, peeling off has not been confirmed in all of the samples.

What is claimed is:

1. A wiring structure of a semiconductor element, the wiring structure comprising a conductor containing a thin film of an intermetallic compound and an insulator layer,
   wherein the intermetallic compound contains a first metal element and a second metal element with an atomic ratio of the first metal element:second metal element in a range from 48.5:51.5 to 51.5:48.5 or from 30:70 to 37:63 so that the wiring structure exhibits excellent conductivity and good adhesion property between the intermetallic compound and the insulator layer which directly and physically contact each other without a diffusion barrier layer interposed therebetween,
   wherein the first metal element is one or more kinds selected from the group consisting of Fe, Co, Ni, Cu, and Zn, and the second metal element is one or more kinds selected from the group consisting of Al and Sb, and wherein a metal oxide layer formed by bonding at least the second metal element with oxygen is interposed between the conductor and the insulator layer.

2. The wiring structure according to claim 1, wherein the intermetallic compound contains two or more kinds of metal elements selected from the group consisting of Al, Fe, Co, Ni, and Zn.

3. The wiring structure according to claim 1, wherein the intermetallic compound is one or more kinds selected from an intermetallic compound containing Co and Al, an intermetallic compound containing Fe and Al, an intermetallic compound containing Ni and Al, an intermetallic compound containing Fe and Co, or an intermetallic compound containing Ni and Zn.

4. The wiring structure according to claim 1, wherein the insulator layer contains an inorganic oxide, an absolute value of standard free energy of oxidation of the first metal element is smaller than an absolute value of standard free energy of oxidation of the insulator layer, and an absolute value of standard free energy of oxidation of the second metal element is larger than the absolute value of standard free energy of oxidation of the insulator layer.

5. The wiring structure according to claim 1, wherein the wiring structure is comprised in a semiconductor device which includes a semiconductor element and a circuit, and the wiring structure is used for connecting the semiconductor element and the circuit to each other in the semiconductor device.

6. The wiring structure according to claim 1, wherein the wiring structure comprises a silicon wafer substrate, a film of the insulator on the silicon wafer substrate, and the conductor on the film of the insulator.

7. The wiring structure according to claim 1, wherein the thin film of the intermetallic compound has columnar crystals in which crystal grains are extended in the film thickness direction.

8. The wiring structure according to claim 1, wherein the intermetallic compound is at least one selected from the group consisting of AlNi, CuAl, NiSb, AlFe, AlCo, CoFe, $CuAl_2$, NiZn, and NiSb.

9. A method of manufacturing the wiring structure according to claim 1, comprising:
heating a substrate having the insulator layer containing an oxide to 100° C. or more and 500° C. or less and vapor-depositing the first and second metal elements on the substrate to form the conductor containing the intermetallic compound.

10. A semiconductor device comprising a semiconductor element, a wiring structure, and a circuit, wherein the wiring structure includes a conductor containing a thin film of an intermetallic compound and an insulator layer and connects the semiconductor element and the circuit to each other,
wherein the intermetallic compound contains a first metal element and a second metal element with an atomic ratio of the first metal element:second metal element in a range from 48.5:51.5 to 51.5:48.5 or from 30:70 to 37:63 so that the wiring structure exhibits excellent conductivity and good adhesion property between the intermetallic compound and the insulator layer which directly and physically contact each other without a diffusion barrier layer interposed therebetween,
wherein the first metal element is one or more kinds selected from the group consisting of Fe, Co, Ni, Cu, and Zn, and the second metal element is one or more kinds selected from the group consisting of Al and Sb, and
wherein a metal oxide layer formed by bonding at least the second metal element with oxygen is interposed between the conductor and the insulator layer.

11. The semiconductor device according to claim 10, wherein the insulator layer contains an inorganic oxide, an absolute value of standard free energy of oxidation of the first metal element is smaller than an absolute value of standard free energy of oxidation of the insulator layer, and an absolute value of standard free energy of oxidation of the second metal element is larger than the absolute value of standard free energy of oxidation of the insulator layer.

* * * * *